(12) United States Patent
Aihara et al.

(10) Patent No.: US 6,734,488 B1
(45) Date of Patent: May 11, 2004

(54) SEMICONDUCTOR DEVICE AND MANUFACTURING METHOD THEREOF

(75) Inventors: Kazuhiro Aihara, Hyogo (JP); Junichi Tsuchimoto, Hyogo (JP); Yutaka Inaba, Hyogo (JP); Kazutoshi Wakao, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/499,037

(22) Filed: Feb. 7, 2000

(30) Foreign Application Priority Data

Aug. 19, 1999 (JP) .......................................... 11-232227

(51) Int. Cl.[7] .................... H01L 27/108; H01L 29/76
(52) U.S. Cl. .................... 257/306; 257/296; 257/288; 257/213
(58) Field of Search .................... 257/68, 71, 213, 257/288, 296, 300, 304, 306, 308, 309, 310, 311, 761, 763, 306.3, 906; 361/303, 305, 306.1, 306.3, 311

(56) References Cited

U.S. PATENT DOCUMENTS

| | | | | |
|---|---|---|---|---|
| 5,612,574 A | * | 3/1997 | Summerfeldt et al. | 257/783 |
| 5,644,151 A | * | 7/1997 | Izumi et al. | 257/306 |
| 5,811,851 A | * | 9/1998 | Nishioka et al. | 257/310 |
| 6,008,123 A | * | 12/1999 | Kook et al. | 438/639 |
| 6,168,991 B1 | * | 1/2001 | Choi et al. | 438/254 |
| 6,211,005 B1 | * | 4/2001 | Kang | 438/238 |
| 6,265,260 B1 | * | 7/2001 | Alers et al. | 438/240 |
| 6,271,596 B1 | * | 8/2001 | Alers | 257/774 |
| 2002/0008257 A1 | * | 1/2002 | Barnak et al. | 257/262 |

FOREIGN PATENT DOCUMENTS

| | | |
|---|---|---|
| JP | 8-293494 | 11/1996 |
| JP | 9-246494 | 9/1997 |
| KR | 1997-0018537 | 4/1997 |
| KR | 1997-0024208 | 5/1997 |
| KR | 1998-0043786 | 9/1998 |

OTHER PUBLICATIONS

Matsuhashi, H. et al., "Optimum Electrode Materials for Ta2O5 Capacitors for High– and Low– Temperature Processes", Jpn. J Appl. Phys., vol. 53, pp. 1293–1297 (1994) (made of record by Applicant in Response filed Sep. 22, 2003).*

Drynan, J.M., et al, "Shared Tungsten Structures for FEOL/BEOL Compatibility in Logic–Friendly Merged DRAM", in Electron Devices Meeting, 1998. IEDM '98 Technical Digest, Int.; pp. 849–852 (Dec. 6–9, 1998)(ISBN: 0–7803–4774–9).*

"Optimum Electrode Materials for $Ta_2O_5$ Capacitors for High– and Low–Temperature Processes", H. Matsuhashi et al., Jpn. J. Appl. Phys., vol. 33 (1994), pp. 1293–1297.

* cited by examiner

Primary Examiner—Nathan Flynn
Assistant Examiner—Johannes Mondt
(74) Attorney, Agent, or Firm—McDermott, Will & Emery

(57) ABSTRACT

A semiconductor device with a capacitor having a charge retaining capability improved by preventing generation of a leakage current in a capacitor dielectric film, and a manufacturing method of the same are provided. An indium oxide film is formed to continuously cover the upper surfaces of a tungsten film and an interlayer oxide film. A tantalum oxide film is formed to continuously cover the surface of the indium oxide film and a portion of the upper surface of the interlayer oxide film. Another indium oxide film is formed to cover the upper surface of the tantalum oxide film.

16 Claims, 18 Drawing Sheets

SEMICONDUCTOR DEVICE AND MANUFACTURING METHOD THEREOF

BACKGROUND OF THE INVENTION

1. Field of the Invention

The present invention relates to a semiconductor device including a capacitor used in a dynamic random access memory (DRAM) or the like, and a method of manufacturing the same.

2. Description of the Background Art

A semiconductor device provided with a DRAM having a capacitor for storing signal information as charges has been used conventionally. Hereinafter, a structure of such a conventional semiconductor device provided with a DRAM having a capacitor will be described with reference to FIG. 18. In the conventional semiconductor device including the DRAM with the capacitor, as shown in FIG. 18, a source/drain region 101 is formed below a main surface of a semiconductor substrate 120 with a prescribed depth. An interlayer oxide film 102 is formed to cover semiconductor substrate 120 including source/drain region 101. A contact hole is formed which penetrates interlayer oxide film 102 to reach source/drain region 101. A storage electrode consisting of a polycrystalline silicon (hereinafter, referred to as "polysilicon") film 103 with an n type impurity introduced therein is formed to fill in the contact hole as well as to continuously cover the upper surface of interlayer oxide film 102. A capacitor dielectric film consisting of a tantalum oxide film 104, expressed as a chemical formula $Ta_2O_5$, is formed to continuously cover the surface of polysilicon film 103 as well as a portion of the upper surface of interlayer oxide film 102. A cell plate electrode consisting of a titanium nitride film 105, expressed as TiN, is formed by chemical vapor deposition (CVD) to cover the upper surface of tantalum oxide film 104.

In the conventional semiconductor device as described above, if a negative bias voltage is applied to the cell plate electrode, electrons in titanium nitride film 105 being the cell plate electrode are introduced into tantalum oxide film 104 being the capacitor dielectric film, whereby a leakage current is generated. This introduction of electrons from the cell plate electrode to the capacitor dielectric film causing the leakage current occurs when energy needed for electrons to exceed a potential barrier, which is determined by a work function of titanium nitride film 105 forming the cell plate electrode, is provided to the electrons within titanium nitride film 105. The fact that the leakage current is generated when the titanium nitride film, the work function of which is 4.95 eV, is used as the electrode means that a material having a work function that is greater than 4.95 eV needs to be used to form the electrode.

Further, in the manufacturing method of the conventional semiconductor device as described above, the step of forming tantalum oxide film 104 being the capacitor dielectric film is followed by the step of depositing titanium nitride film 105 that is to be the cell plate electrode. In this step of depositing titanium nitride film 105, ammonia ($NH_3$) gas causing reduction is used, and thus, oxygen atoms that are components of tantalum oxide film 104 are eliminated. This causes a deficiency of oxygen atoms in tantalum oxide film 104, which in turn causes generation of a leakage current in the capacitor dielectric film.

The amount of charges stored in the capacitor reduces over time, due to the leakage current generated in the capacitor as described above. As a result, the charge retaining capability of the capacitor is diminished, which results in the degradation of refresh performance of the capacitor.

SUMMARY OF THE INVENTION

An object of the present invention is to provide a semiconductor device provided with a capacitor with an improved charge retaining capability, by suppressing generation of a leakage current in the capacitor dielectric film.

The semiconductor device according to a first aspect of the present invention includes: a contact plug including a tungsten film in the upper portion thereof, formed on a semiconductor substrate; a storage electrode including a tantalum nitride film formed on and contacting an upper surface of the tungsten film; a capacitor dielectric film including a tantalum oxide film formed on and contacting an upper surface of the tantalum nitride film; and a cell plate electrode including a tantalum nitride film formed on and contacting an upper surface of the tantalum oxide film.

In such a structure, the storage electrode and the cell plate electrode are formed of tantalum nitride film, the work function of which is greater than that of the titanium nitride film used to form the cell plate electrode of the capacitor in the conventional semiconductor device. This restricts introduction of electrons into the tantalum oxide film forming the capacitor dielectric film. Thus, it is possible to suppress generation of a leakage current in the capacitor dielectric film.

Further, the contact plug is formed using the tungsten film. Therefore, it is possible to prevent oxidation of the upper surface of the contact plug, which would be inevitable during a manufacturing process when a polysilicon film is used to form the storage electrode as in the case of the conventional semiconductor device. This prevents formation of additional capacitance because of the oxidation of the upper surface of the contact plug. As a result, reduction of capacitance of the capacitor is suppressed.

Moreover, the tantalum nitride film offering an effective barrier is formed on the tungsten film. Thus, counter diffusion between the tungsten film and the tantalum nitride film is prevented. This restricts generation of a leakage current in the capacitor dielectric film due to the counter diffusion between the contact plug and the storage electrode. As a result, the charge retaining capability of the capacitor is improved.

The semiconductor device according to a second aspect includes: a storage electrode including a tantalum nitride film formed on a semiconductor substrate; a capacitor dielectric film including a tantalum oxide film formed on and contacting an upper surface of the tantalum nitride film; and a cell pate electrode including a tantalum nitride film formed on and contacting an upper surface of the tantalum oxide film and a copper film formed on and contacting an upper surface of the tantalum nitride film.

In such a structure, the copper film used for the cell plate electrode is highly conductive, which increases drift speed of electrons within the cell plate electrode. Therefore, a capacitor can respond to the signal charges given to the capacitor at a greater response speed. As a result, the operating speed of the semiconductor device is increased. In addition, a part of the cell plate electrode is formed of the tantalum nitride film offering a good barrier, which prevents counter diffusion between the tantalum nitride film and the copper film. Thus, generation of a leakage current in the capacitor dielectric film due to the counter diffusion within the cell plate electrode is restricted. As a result, it is again possible to improve the charge retaining capability of the capacitor when the copper film is used as a portion of the cell plate electrode to increase the conductivity of the cell plate electrode.

The semiconductor device according to a third aspect of the present invention includes: a storage electrode including an indium oxide film formed on a semiconductor substrate; a capacitor dielectric film including a tantalum oxide film formed on and contacting an upper surface of the indium oxide film; and a cell plate electrode including an indium oxide film formed on and contacting an upper surface of the tantalum oxide film.

In such a structure, the storage electrode and the cell plate electrode are formed of indium oxide film, which minimizes the likelihood of a reductive elimination reaction of the tantalum oxide film forming the capacitor dielectric film occurring during the manufacturing process. Accordingly, possibility of elimination of oxygen atoms within the tantalum oxide film due to the reductive reaction is reduced. Thus, a high degree of crystallinity is kept for the tantalum oxide film constituting the capacitor dielectric film. This restricts generation of a leakage current in the capacitor dielectric film due to the deficiency of the oxygen atoms within the tantalum oxide film. As a result, it is possible to increase the charge retaining capability of the capacitor.

Preferably, in the semiconductor device according to the third aspect of the present invention, the storage electrode includes a tantalum nitride film formed beneath and contacting the lower surface of the indium oxide film.

In such a structure, the tantalum oxide film formed beneath and contacting the lower surface of the indium oxide film offers an effective barrier, which restricts counter diffusion between the indium oxide film and a conductive material used for the contact plug. Thus, it is possible to restrict generation of a leakage current in the capacitor dielectric film due to the counter diffusion between the indium oxide film and the conductive material used for the contact plug. As a result, by forming the storage electrode using indium oxide film that is unlikely to cause reductive reaction of the tantalum oxide film during the manufacturing process, it is again possible to improve the charge retaining capability of the capacitor.

More preferably, in the semiconductor device according to the third aspect of the present invention, the cell plate electrode includes a copper film formed on the indium oxide film.

In such a structure, the highly conductive copper film is used to form a part of the cell plate electrode. Thus, drift speed of the electrons within the cell plate electrode increases, and accordingly, the capacitor can respond to the signal charges given to the capacitor at a higher speed. As a result, the operating speed of the semiconductor device is increased.

Still more preferably, in the semiconductor device according to the third aspect of the present invention, in the case where the cell plate electrode includes the copper film on the indium oxide film, the cell plate electrode includes a tantalum nitride film formed between the indium oxide film and the copper film, contacting the both films.

In such a structure, the tantalum nitride film is formed between the two layers of the cell plate electrode, i.e., the indium oxide film and the copper film. This restricts counter diffusion between the indium oxide film and the copper film, and thus, generation of a leakage current in the capacitor dielectric film due to the counter diffusion within the cell plate electrode is restricted. As a result, it is possible to improve the charge retaining capability of the capacitor when the copper film is used as a part of the cell plate electrode to increase the operating speed of the semiconductor device.

The manufacturing method of the semiconductor device according to the first aspect of the present invention includes the steps of: forming a contact plug including a tungsten film on a semiconductor substrate; forming a storage electrode including a tantalum nitride film contacting an upper surface of the tungsten film; forming a capacitor dielectric film including a tantalum oxide film contacting an upper surface of the tantalum nitride film; and forming a cell plate electrode including a tantalum nitride film contacting an upper surface of the tantalum oxide film.

With such a manufacturing method, the storage electrode and the cell plate electrode are formed using tantalum nitride film, the work function of which is higher than that of the titanium nitride film that is used when manufacturing the cell plate electrode of the capacitor in the conventional semiconductor device. Therefore, a capacitor can be formed in which it is less likely that electrons are introduced into the tantalum oxide film forming the capacitor dielectric film. Thus, it is possible to manufacture a semiconductor device provided with a capacitor in which a leakage current is less likely to be generated in the capacitor dielectric film.

Further, the tungsten film is used to form a part of the contact plug. This prevents oxidation of the upper surface of the contact plug, which would be inevitable during manufacturing the storage electrode using the polysilicon film, as in the case of the conventional semiconductor device. Therefore, a capacitor can be formed in which formation of an additional capacitance due to the oxidation of the upper surface of the contact plug is prevented. As a result, it is possible to manufacture a semiconductor device in which reduction of the capacitance of the capacitor is restricted.

Moreover, the tantalum nitride film is formed on the tungsten film, which offers a good barrier. Thus, counter diffusion between the tungsten film and the tantalum nitride film is less likely to occur. As a result, a semiconductor device can be formed in which generation of a leakage current in the capacitor dielectric film due to the counter diffusion of the contact plug and the storage electrode is suppressed. Accordingly, it is possible to manufacture a semiconductor device provided with a capacitor with an improved charge retaining capability.

The manufacturing method of the semiconductor device according to the second aspect of the present invention includes the steps of: forming a storage electrode including a tantalum nitride film on a semiconductor substrate; forming a capacitor dielectric film including a tantalum oxide film contacting an upper surface of the tantalum nitride film; and forming a cell plate electrode by first forming a tantalum nitride film contacting an upper surface of the tantalum oxide film and then forming a copper film contacting an upper surface of the tantalum nitride.

With such a manufacturing method, the cell plate electrode is formed using the highly conductive copper film. This enables formation of a capacitor in which electrons within the cell plate electrode move at a high speed. Accordingly, the capacitor is allowed to respond to the signal charges given to the capacitor with a high response speed. Thus, it is possible to manufacture a semiconductor device provided with a capacitor operating at a high speed.

Further, the tantalum nitride film is formed as a part of the cell plate electrode, which offers a good barrier. Thus, a cell plate electrode can be formed in which counter diffusion between the tantalum nitride film and the copper film is less likely to occur. Therefore, a capacitor can be formed in which generation of a leakage current in the capacitor dielectric film due to the counter diffusion within the cell plate electrode is suppressed. As a result, it is possible to manufacture a semiconductor device provided with a capacitor with an improved charge retaining capability when a copper film is used as a portion of a cell plate electrode to increase conductivity of the cell plate electrode.

The manufacturing method of the semiconductor device according to the third aspect of the present invention includes the steps of: forming a storage electrode including a indium oxide film on a semiconductor substrate; forming a capacitor dielectric film including a tantalum oxide film contacting an upper surface of the indium oxide film; and forming a cell plate electrode including an indium oxide film contacting an upper surface of the tantalum oxide film.

With such a manufacturing method, as the indium oxide film is used, reductive reaction of the tantalum oxide film forming the capacitor dielectric film is unlikely to occur during the manufacturing process. Thus, possibility of elimination of oxygen atoms within the tantalum oxide film due to the reductive reaction is minimized. Therefore, a capacitor can be formed in which the tantalum oxide film constituting the capacitor dielectric film keeps a high degree of crystallinity, and thus, it is possible to form a capacitor in which generation of a leakage current in the capacitor dielectric film due to the deficiency of oxygen atoms within the tantalum oxide film is restricted. As a result, it is possible to manufacture a semiconductor device provided with a capacitor with an improved charge retaining capability.

Preferably, in the manufacturing method of the semiconductor device according to the third aspect of the present invention, the step of forming the storage electrode includes the step of forming a tantalum nitride film and the step of forming an indium oxide film contacting an upper surface of the tantalum nitride film.

With such a manufacturing method, the tantalum nitride film offering an effective barrier is formed beneath and contacting the lower surface of the indium oxide film forming the storage electrode. Therefore, a capacitor can be formed in which counter diffusion between the indium oxide film and a conductive material used for the contact plug is suppressed. This allows formation of a capacitor in which generation of a leakage current in the capacitor dielectric film due to the counter diffusion between the indium oxide film and the conductive material used for the contact plug is suppressed. As a result, it is possible to manufacture a semiconductor device provided with a capacitor with an improved charge retaining capability when the storage electrode is formed using the indium oxide film which is unlikely to cause reduction of the tantalum oxide film during the manufacturing process.

More preferably, in the manufacturing method of the semiconductor device according to the third aspect of the present invention, the step of forming the cell plate electrode includes the step of forming an indium oxide film and the step of forming a copper film on the indium oxide film.

With such a manufacturing method, the highly conductive copper film is formed as a part of the cell plate electrode, which allows formation of a capacitor in which electrons within the cell plate electrode move at a high speed. This increases the response speed of the capacitor when it responds to the signal charges given to the capacitor. It is thus possible to manufacture a semiconductor device which operates at a high speed.

Still more preferably, in the manufacturing method of the semiconductor device according to the third aspect of the present invention, in the case where the step of forming the cell plate electrode includes the step of forming the indium oxide film and the step of forming the copper film on the indium oxide film, the step includes the step of forming a tantalum nitride film contacting an upper surface of the indium oxide film, after the formation of the indium oxide film and before the formation of the copper film.

With such a manufacturing method, the tantalum nitride film a offering a good barrier is formed between two layers of the cell plate electrode, i.e., the indium oxide film and the copper film. This allows formation of a cell plate electrode in which counter diffusion between the indium oxide film and the copper film is restricted. Thus, a capacitor can be formed in which generation of a leakage current in the capacitor dielectric film due to the counter diffusion of the indium oxide film and the copper film is suppressed. As a result, it is possible to manufacture a semiconductor device provided with a capacitor with an improved charge retaining capability when a copper film is used as a part of the cell plate electrode to form a capacitor having a high operating speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
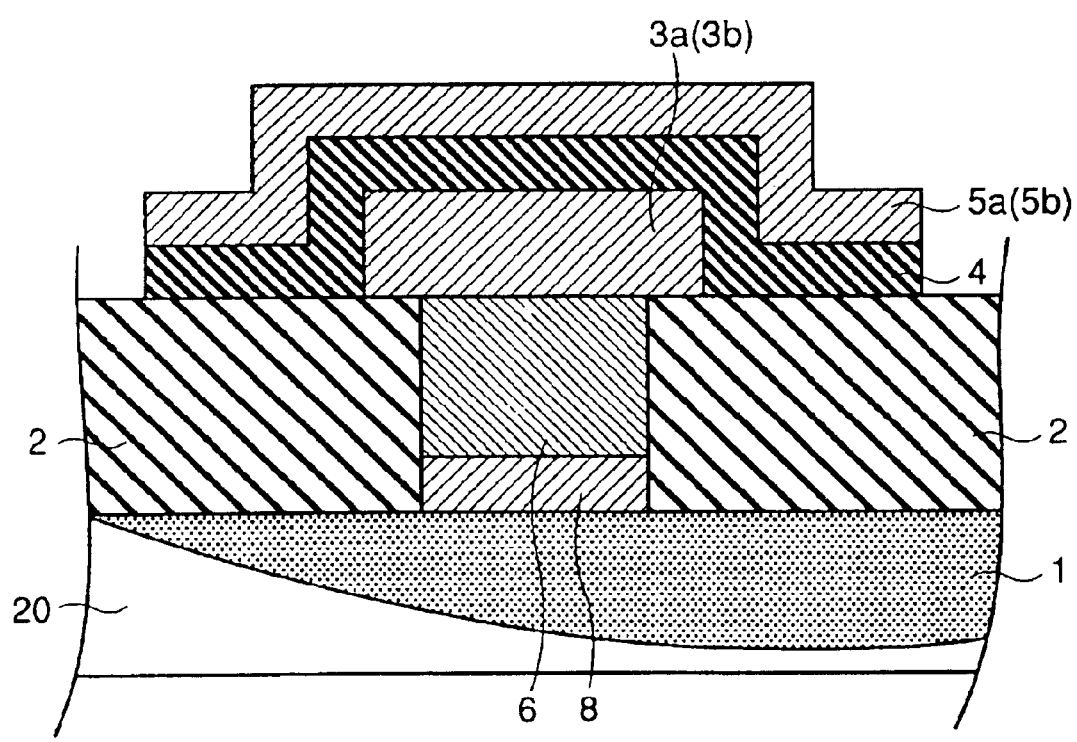
FIG. 1 is a diagram schematically showing a cross sectional structure of a semiconductor device according to first and second embodiments of the present invention.

First, a structure of the semiconductor device provided with a DRAM having a capacitor according to the first embodiment of the present invention will be described with reference to FIG. 1. The semiconductor device provided with the DRAM having the capacitor according to the present embodiment includes, as shown in FIG. 1, a source/drain region 1 formed below a main surface of a semiconductor substrate 20 with a prescribed depth. An interlayer oxide film 2 is formed to cover semiconductor substrate 20 including source/drain region 1. A contact hole is formed which penetrates interlayer oxide film 2 to reach source/drain region 1. A titanium nitride film 8 is formed at the bottom of the contact hole as a barrier metal film. A tungsten film 6 is formed on titanium nitride film 8 to fill in the contact hole. A tantalum nitride film 3a, expressed as a chemical formula $TaN_x$, is formed to continuously cover upper surfaces of tungsten film 6 and interlayer oxide film 2. A tantalum oxide film 4, expressed as $Ta_2O_5$, is formed to continuously cover the surface of tantalum nitride film 3a and a portion of the upper surface of interlayer oxide film 2. A tantalum nitride film 5a is formed to cover the upper surface of tantalum oxide film 4.

In the semiconductor device according to the present embodiment, the storage electrode and the cell plate electrode are formed using tantalum nitride films 3a and 5a, the work function of which is 5.41 eV. That is, the semiconductor device according to the present embodiment uses, for formation of the electrodes of the capacitor, a material with a work function that is greater than the 4.95 eV of titanium nitride film 105 which was used for the electrodes of the capacitor in the conventional semiconductor device. Introduction of electrons into tantalum oxide film 4 forming the capacitor dielectric film is thus restricted. As a result, generation of a leakage current in the capacitor dielectric film is suppressed.

Further, the contact plug is formed using tungsten film 6. This prevents oxidation of the upper surface of the contact plug that is inevitable during manufacturing the storage electrode using polysilicon film 103, as in the case of the conventional semiconductor device. Thus, formation of additional capacitance due to the oxidation of the upper surface of the contact plug is prevented. As a result, reduction in capacitance of the capacitor is prevented.

Moreover, tantalum nitride film 3a is formed on tungsten film 6, which offers an effective barrier. Thus, counter diffusion between tungsten film 6 and tantalum nitride film 3a is less likely to occur. Therefore, generation of a leakage current in the capacitor dielectric film due to the counter diffusion of the contact plug and the storage electrode is restricted. As a result, the charge retaining capability of the capacitor is improved.

Figure 2:
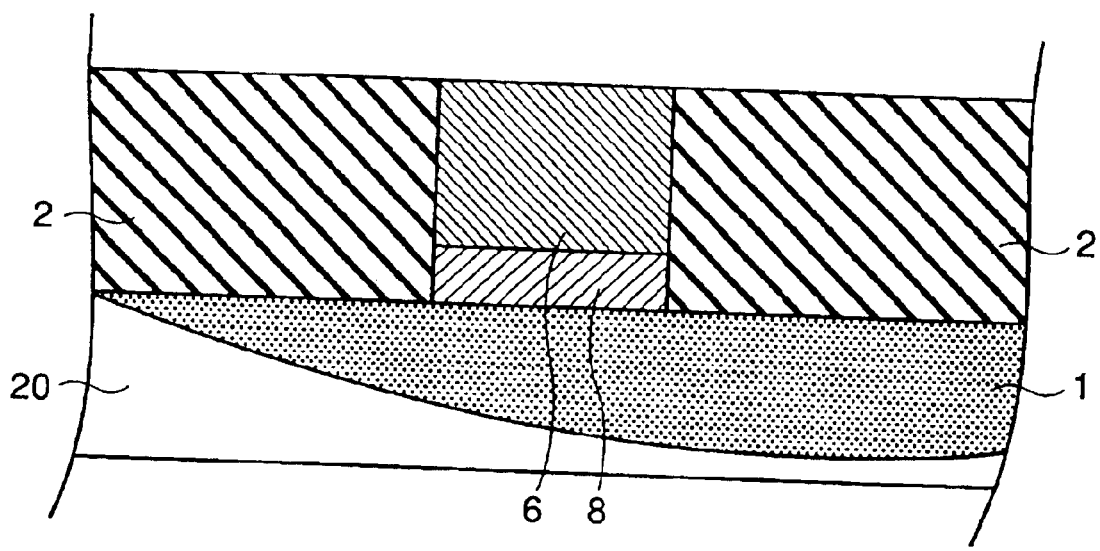
FIGS. 2, 3, 4, 5 and 6 are diagrams successively showing process steps of manufacturing the semiconductor device according to the first and second embodiments of the present invention.

A manufacturing method of the semiconductor device provided with a DRAM having a capacitor according to the first embodiment of the present invention will now be described with reference to FIGS. 1 to 6. In the manufacturing method of the semiconductor device according to the present invention, source/drain region 1 is first formed below the main surface of semiconductor substrate 20 with a prescribed depth. Next, interlayer oxide film 2 is formed to cover semiconductor substrate 20 including source/drain region 1. Thereafter, a contact hole is formed to penetrate interlayer oxide film 2 to reach source/drain region 1. Next, titanium nitride film 8 is formed as a barrier metal film, at the bottom of the contact hole. Thereafter, a tungsten film 6 is formed on titanium nitride film 8 to fill in the contact hole. Thus, the structure shown in FIG. 2 is obtained.

Figure 3:
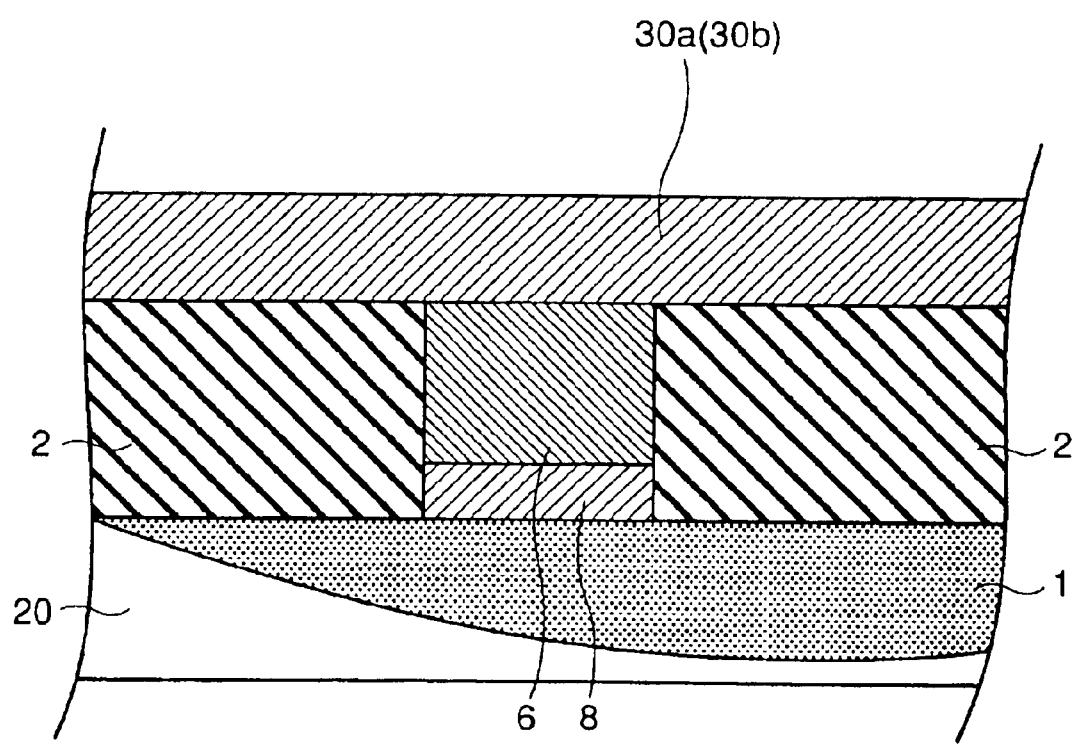
Figure 4:
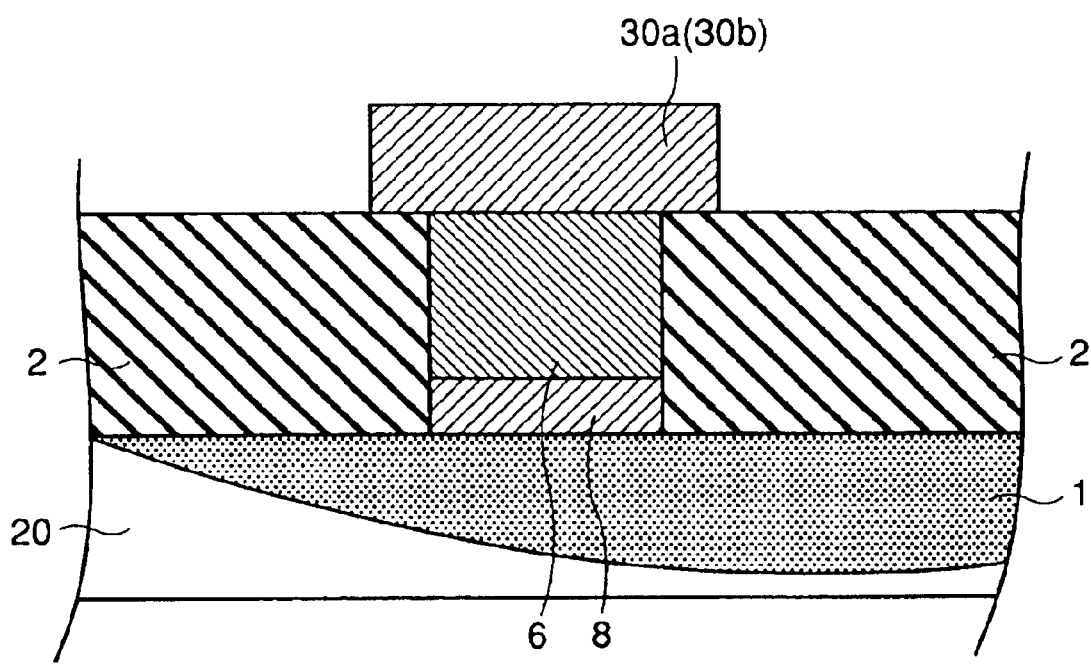
Figure 5:
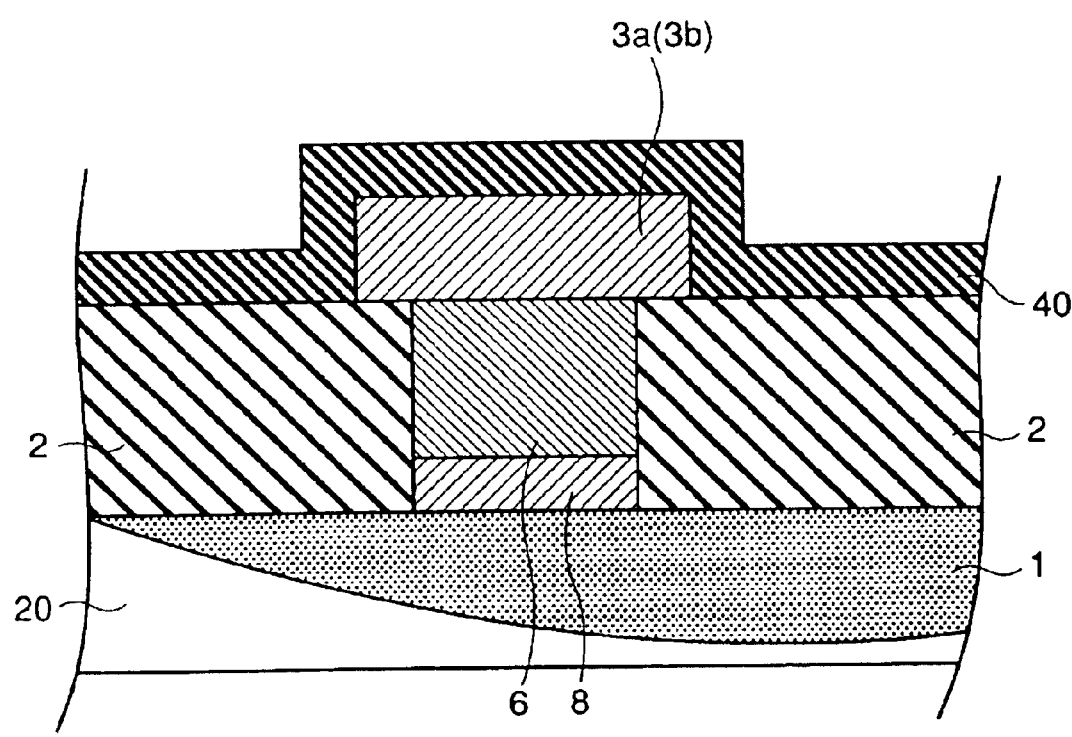
Figure 6:
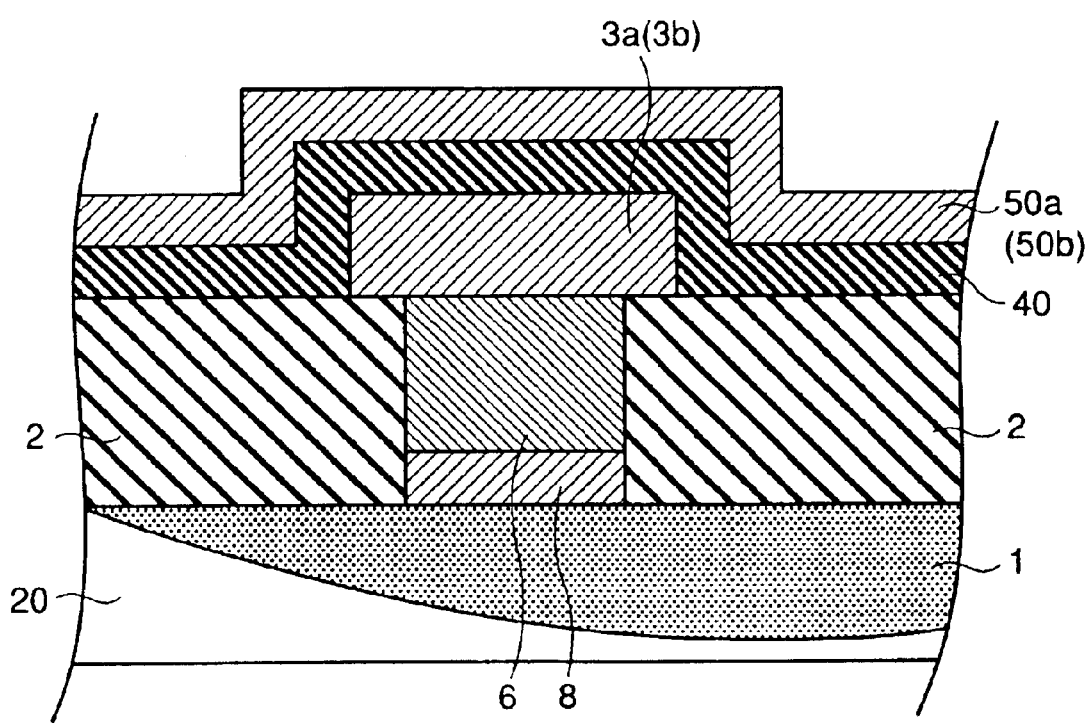

Next, as shown in FIG. 3, tantalum nitride ($TaN_x$) film 30a is formed by sputtering to continuously cover the upper surfaces of tungsten film 6 and interlayer oxide film 2. In this sputtering for forming tantalum nitride film 30a, tantalum as a target is first made to collide with 50 cc/min of Ar gas under a pressure of 30 mTorr, and tantalum nitride generated by reaction of the tantalum and 20 cc/min of nitride gas is sputtered on tungsten film 6 and interlayer oxide film 2. Next, as shown in FIG. 4, tantalum nitride film 30a is etched to a prescribed pattern to form tantalum nitride film 3a that is to be a storage electrode. Thereafter, as shown in FIG. 5, tantalum oxide ($Ta_2O_5$) film 40 is formed by CVD to continuously cover the surface of tantalum nitride film 3a and the upper surface of interlayer oxide film 2. In this CVD for forming tantalum oxide film 40, $Ta(OC_2H_5)$ as a raw material is forced to react within oxygen gas, and then, tantalum oxide obtained is deposited to cover the surface of tantalum nitride film 3a under a pressure of 1 Torr at a temperature of 450 ° C. Next, as shown in FIG. 6, tantalum nitride film 50a is formed to cover the upper surface of tantalum oxide film 40. Thereafter, tantalum oxide film 40 and tantalum nitride film 50a are etched into a prescribed pattern to form tantalum oxide film 4 as the capacitor dielectric film and tantalum nitride film 5a as the cell plate electrode, as shown in FIG. 1. Thus, the capacitor of the semiconductor device according to the present embodiment is completed.

In the manufacturing method of the semiconductor device according to the present embodiment, the storage electrode and the cell plate electrode are formed using tantalum nitride films 30a and 50a, the work function of which is 5.41 eV. In other words, according to the manufacturing method of the semiconductor device of the present embodiment, the electrodes of the capacitor are formed using a material of which work function is greater than the 4.95 eV work function of titanium nitride film 105.

With such a manufacturing method, the storage electrode and the cell plate electrode are formed with tantalum nitride films 3a and 5a having a high work function. This allows formation of a capacitor in which it is less likely that electrons are introduced into tantalum oxide film 4 constituting the capacitor dielectric film. Accordingly, the possibility of generation of a leakage current in the capacitor dielectric film is diminished. It is thus possible to manufacture a semiconductor device provided with a capacitor in which degradation of the charge retaining capability is suppressed.

Further, tungsten film 6 is formed as a part of the contact plug. This prevents oxidation of the upper surface of the contact plug that would be inevitable during the manufacturing process if a polysilicon film is used to form a capacitor of a semiconductor device, as in the conventional case. Therefore, a capacitor can be formed in which generation of additional capacitance due to the oxidation of the upper surface of the contact plug is prevented. As a result, it is possible to manufacture a semiconductor device in which reduction of capacitance of a capacitor is restricted.

Moreover, tantalum nitride film 3a offering an effective barrier is formed on tungsten film 6. This allows formation of the contact plug and the storage electrode with tungsten film 6 and tantalum nitride film 3a, respectively, wherein counter diffusion between them is less likely to occur. As a result, a capacitor can be formed in which generation of a leakage current in the capacitor dielectric film due to the counter diffusion between the contact plug and the storage electrode is restricted. As a result, it is possible to manufacture a semiconductor device having a capacitor with an improved charge retaining capability.

Second Embodiment

Now, a structure of a semiconductor device provided with a DRAM having a capacitor according to the second embodiment of the present invention will be described with reference to FIG. 1, same as the first embodiment. The entire structure of the semiconductor device provided with the DRAM having the capacitor of the present embodiment is identical to that of the semiconductor device of the first embodiment, as shown in FIG. 1. However, the two embodiments are different from each other in the following manner. In the first embodiment, tantalum nitride films 3a and 5a are used as the storage electrode and the cell plate electrode to sandwich, from bottom and top, tantalum oxide film 4 being the capacitor dielectric film. In contrast, in the present embodiment, indium oxide ($In_2O_3$) films 3b and 5b are used, instead of tantalum nitride films 3a and 5a, to form the storage and cell plate electrodes. In FIG. 1, the structure of the semiconductor device according to the present embodiment is indicated using reference numerals in parentheses, (3b) and (5b), instead of 3a and 5a.

With such a structure, the electrodes of the capacitor are formed using indium oxide films 3b and 5b, which is unlikely to cause reductive reaction of tantalum oxide film 4 during the manufacturing process. Thus, possibility of elimination of oxygen atoms within tantalum oxide film 4 constituting the capacitor dielectric film is minimized, whereby tantalum oxide film 4 forming the capacitor dielectric film maintains a high degree of crystallinity. Accordingly, generation of a leakage current in the capacitor dielectric film due to the deficiency of oxygen atoms within tantalum oxide film 4 is suppressed. As a result, the charge retaining capability of the capacitor is improved.

A manufacturing method of the semiconductor device provided with the DRAM having the capacitor according to the second embodiment of the present invention will now be described with reference to FIGS. 1 to 6, as in the case of the first embodiment. The manufacturing method of the semiconductor device according to the present embodiment includes process steps substantially identical to those in the first embodiment illustrated in FIGS. 1 to 6. A difference between the two embodiments is that, in the process steps of forming the storage electrode and the cell plate electrode illustrated in FIGS. 3 and 6, respectively, tantalum nitride films 30a and 50a are sputtered in the first embodiment, whereas indium oxide films 30b and 50b are sputtered in the second embodiment. The manufacturing method of the semiconductor device according to the present embodiment is illustrated using reference numerals in parentheses, (3b), (5b), (30b) and (50b), instead of 3a, 5a, 30a and 50a, in the drawings.

With such a manufacturing method, indium oxide films 30b and 50b that is unlikely to cause, during the manufacturing process, reductive reaction of tantalum oxide film 40 constituting the capacitor dielectric film are utilized, and thus, possibility of elimination of oxygen atoms within tantalum oxide film 40 due to the reductive reaction is minimized. Therefore, a capacitor can be formed in which tantalum oxide film 4 forming the capacitor dielectric film keeps a high degree of crystallinity. Accordingly, generation of a leakage current in the capacitor dielectric film due to the deficiency of oxygen atoms within tantalum oxide film 4 is suppressed. As a result, it is possible to manufacture a semiconductor device having a capacitor with an improved charge retaining capability.

Third Embodiment

Figure 7:
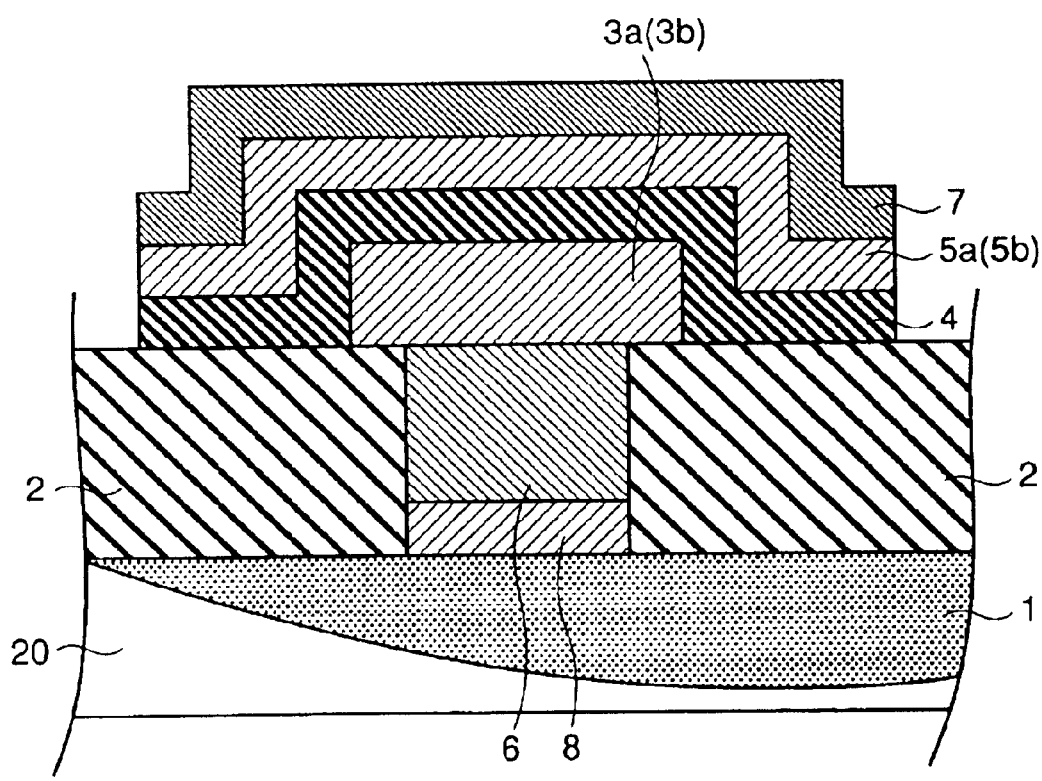
FIG. 7 is a diagram schematically showing a cross sectional structure of a semiconductor device according to a third embodiment of the present invention.

A structure of the semiconductor device provided with a DRAM having a capacitor according to the third embodiment of the present invention will now be described with reference to FIG. 7. As shown in FIG. 7, the entire structure of the semiconductor device provided with the DRAM having the capacitor according to the present embodiment is essentially the same as that of the first embodiment illustrated in FIG. 1. However, in the present embodiment, the cell plate electrode is made of a tantalum nitride film 5a and a copper film 7 contacting the upper surface of tantalum nitride film 5a.

With such a structure, highly conductive copper film 7 is used to form a part of the cell plate electrode. This increases the drift speed of electrons within the cell plate electrode, and hence, increases the response speed of the capacitor to respond signal charges given to the capacitor. As a result, the operating speed of the semiconductor device is increased.

Further, tantalum nitride film 5a offering an effective barrier is formed as a part of the cell plate electrode, which suppresses counter diffusion between tantalum nitride film 5a and copper film 7. Therefore, generation of a leakage current in the capacitor dielectric film due to the counter diffusion within the cell plate electrode is restricted. It is thus possible to improve the charge retaining capability of the capacitor when the copper film is used as a portion of the cell plate electrode to improve conductivity of the cell plate electrode.

Moreover, the semiconductor device of the present embodiment is described in which copper film 7 is formed on tantalum nitride film 5a that is present in the case of the first embodiment. However, even when the copper film 7 is formed on indium oxide film 5b that is formed in the second embodiment, it is also possible to obtain the same effects, such as the increase in the operating speed of the semiconductor device, and the improvement in the charge retaining capability.

Figure 8:
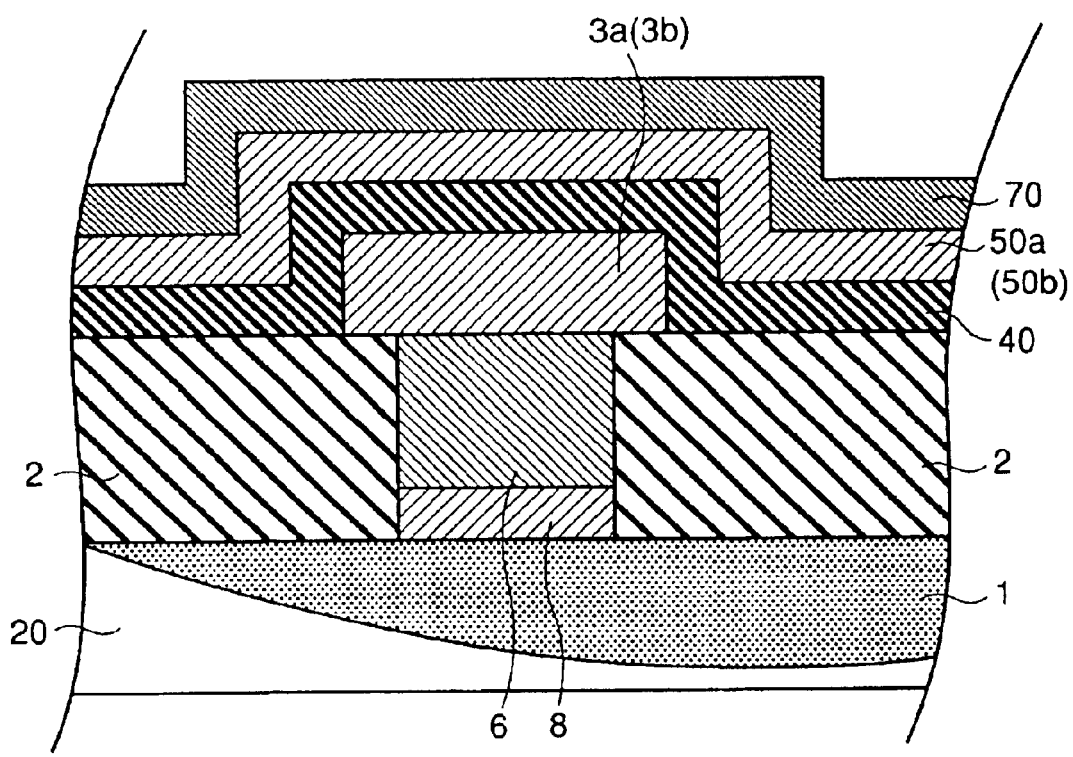
FIG. 8 is a diagram illustrating a process step of manufacturing the semiconductor device according to the third embodiment of the present invention.

A manufacturing method of the semiconductor device provided with the DRAM having the capacitor according to the third embodiment will now be described with reference to FIGS. 6 to 8. The manufacturing method of the semiconductor device according to the present embodiment includes process steps substantially identical to those of the method of the first embodiment, except that, after the structure as shown in FIG. 6 of the first embodiment is obtained, copper film 70 is further formed by sputtering on tantalum nitride film 50a, as shown in FIG. 8, and then, tantalum oxide film 40, tantalum nitride film 50a and copper film 70 are etched together.

With such a manufacturing method, highly conductive copper film 7 is formed as a part of the cell plate electrode. Thus, a capacitor can be formed in which electrons within the cell plate electrode drift at a high speed, which allows the capacitor to respond to the signal charges given thereto with an increased response speed. It is thus possible to manufacture a semiconductor device which operates at a high speed.

Further, the cell plate electrode is formed using tantalum nitride film 5a offering a good barrier, which suppresses counter diffusion of tantalum nitride film 5a and copper film 7. Therefore, a capacitor can be formed in which generation of a leakage current in the capacitor dielectric film due to the counter diffusion within the cell plate electrode is restricted. As a result, it is possible to manufacture a semiconductor device having a capacitor with an improved charge retaining capability when a copper film is used as a part of the cell plate electrode to increase conductivity of the cell plate electrode.

Moreover, in the manufacturing method of the semiconductor device according to the present embodiment, copper film 7 is further formed on tantalum nitride film 5a that is formed in the manufacturing method of the semiconductor device according to the first embodiment. However, even when the copper film 7 is formed on indium oxide film 5b that is formed in the manufacturing method of the semiconductor device according to the second embodiment, it is possible to obtain the same effects that the semiconductor device operating at a high speed can be formed, and that the semiconductor device with an improved charge retaining capability can be formed.

Fourth Embodiment

Figure 9:
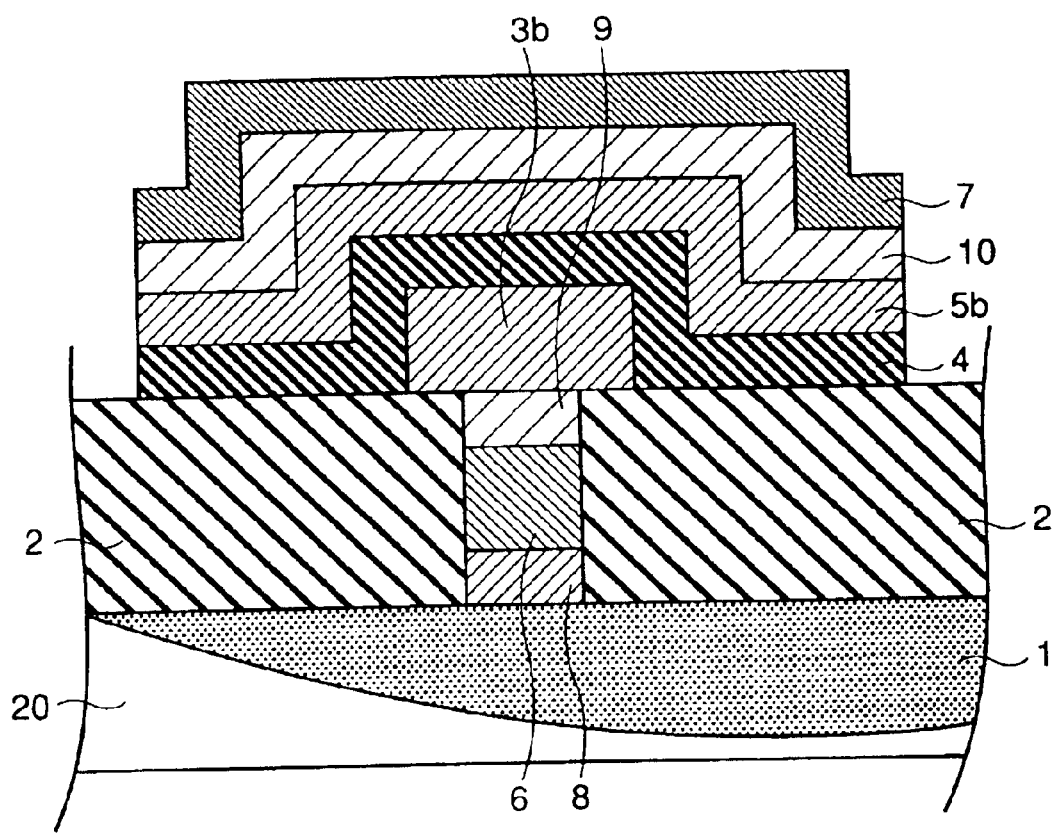
FIG. 9 is a diagram schematically showing a cross sectional structure of a semiconductor device according to a fourth embodiment of the present invention.

A structure of the semiconductor device provided with a DRAM having a capacitor according to the fourth embodiment of the present invention will now be described with reference to FIG. 9. As shown in FIG. 9, in the semiconductor device provided with the DRAM having the capacitor of the present embodiment, source/drain region 1 is formed below the main surface of semiconductor substrate 20 with a prescribed depth. Interlayer oxide film 2 is formed to cover semiconductor substrate 20 including source/drain region 1. A contact hole is formed to penetrate interlayer oxide film 2 to reach source/drain region 1. Titanium nitride film 8 is formed as a barrier metal film at the bottom of the contact hole. Tungsten film 6 is formed on titanium nitride film 8. On tungsten film 6, tantalum nitride film 9 offering a good barrier is formed to fill in the contact hole, which film constitutes a part of the storage electrode. Indium oxide ($In_2O_5$) film 3b is formed to continuously cover the upper surfaces of tantalum nitride film 9 and interlayer oxide film 2. Tantalum oxide ($Ta_2O_5$) film 4 is formed to continuously cover the surface of indium oxide film 3b and a portion of the upper surface of interlayer oxide film 2. Indium oxide film 5b is formed to cover the upper surface of tantalum oxide film 4. Tantalum nitride film 10 is formed on the upper surface of indium oxide film 5b. Copper film 7 is formed on the upper surface of tantalum nitride film 10.

With such a structure, tantalum nitride film 9 is formed beneath and contacting the lower surface of indium oxide film 3b constituting the stage electrode, which suppresses counter diffusion of indium oxide film 3b and tungsten film 6. Therefore, generation of a leakage current in the capacitor dielectric film due to the counter diffusion of the contact plug and the storage electrode is restricted. As a result, it is possible to improve the charge retaining capability of the capacitor when the storage electrode is formed using the indium oxide film that is unlikely to cause reduction of the tantalum oxide film during the manufacturing process.

Further, tantalum nitride film 10 is formed between two layers of the cell plate electrode, i.e., indium oxide film 5b and copper film 7. This suppresses counter diffusion of indium oxide film 5b and copper film 7. Therefore, generation of a leakage current in the capacitor dielectric film due to the counter diffusion within the cell plate electrode is restricted. As a result, it is again possible to improve the charge retaining capability of the capacitor when the cell plate electrode is formed using the copper film to increase the response speed of the capacitor.

Figure 10:
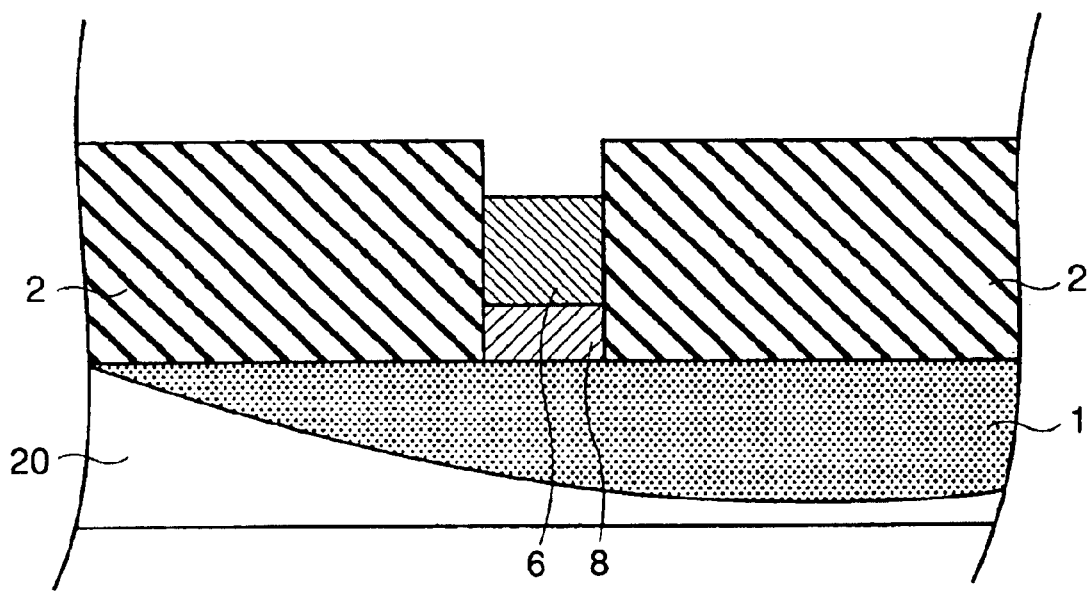
FIGS. 10, 11, 12, 13, 14, 15, 16 and 17 are diagrams successively showing process steps of manufacturing the semiconductor device according to the fourth embodiment of the present invention.

A manufacturing method of the semiconductor device provided with the DRAM having the capacitor according to the fourth embodiment of the present invention will now be described with reference to FIGS. 9 to 17. In the manufacturing method of the semiconductor device of the present embodiment, a source/drain region 1 is first formed below the main surface of a semiconductor substrate 20 with a prescribed depth. Next, an interlayer oxide film 2 is formed to cover semiconductor substrate 20 including source/drain region 1. Thereafter, a contact hole is formed to penetrate interlayer oxide film 2 to reach source/drain region 1. Next, a titanium nitride film 8 as a barrier metal film is formed at the bottom of the contact hole. Thereafter, a tungsten film 6 is formed on titanium nitride film 8 to fill in the contact hole up to a certain height. The structure shown in FIG. 10 is thus obtained.

Figure 11:
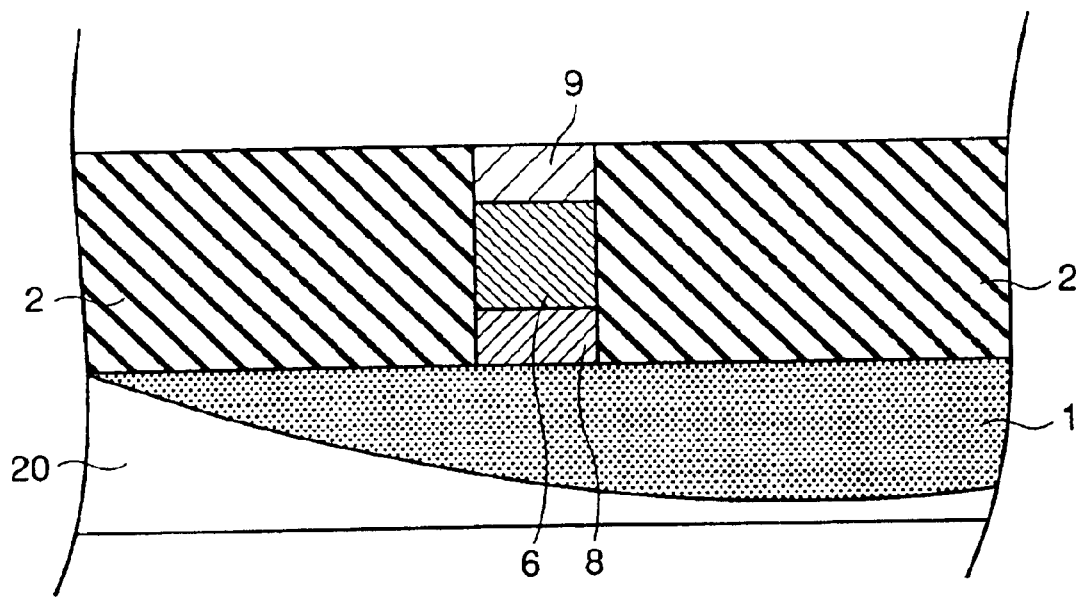
Figure 12:
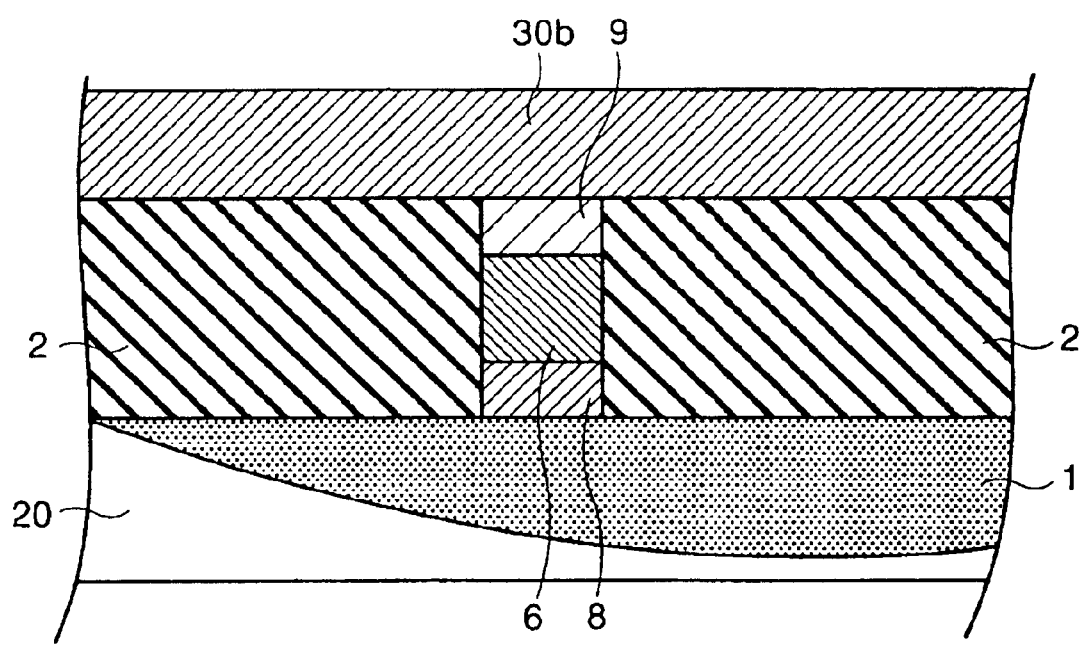

Thereafter, as shown in FIG. 11, tantalum nitride film 9 is formed to fill in the contact hole, which film becomes a part of the storage electrode and serves as a barrier metal. Next, as shown in FIG. 12, indium oxide ($In_2O_3$) film 30b is formed by sputtering to continuously cover the upper surfaces of tantalum nitride film 9 and interlayer oxide film 2.

Figure 13:
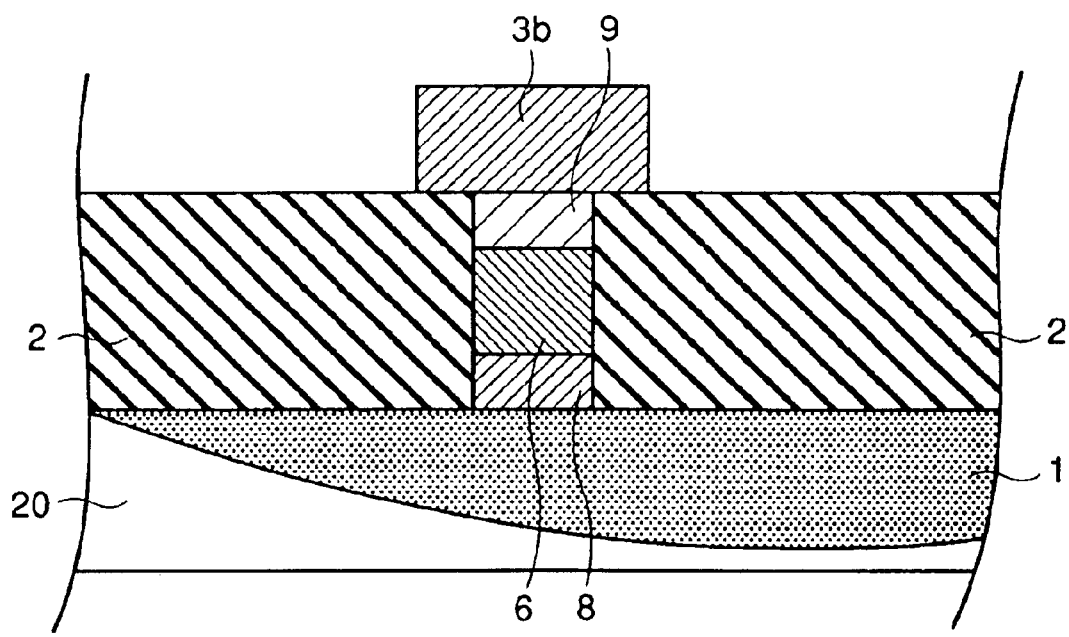
Figure 14:
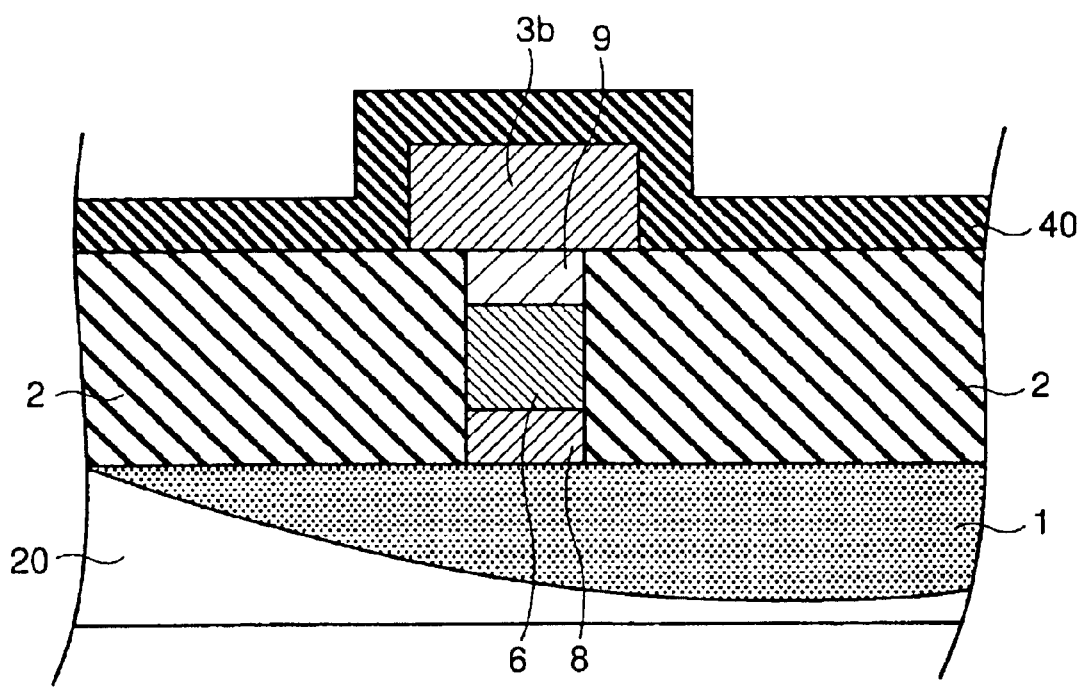
Figure 15:
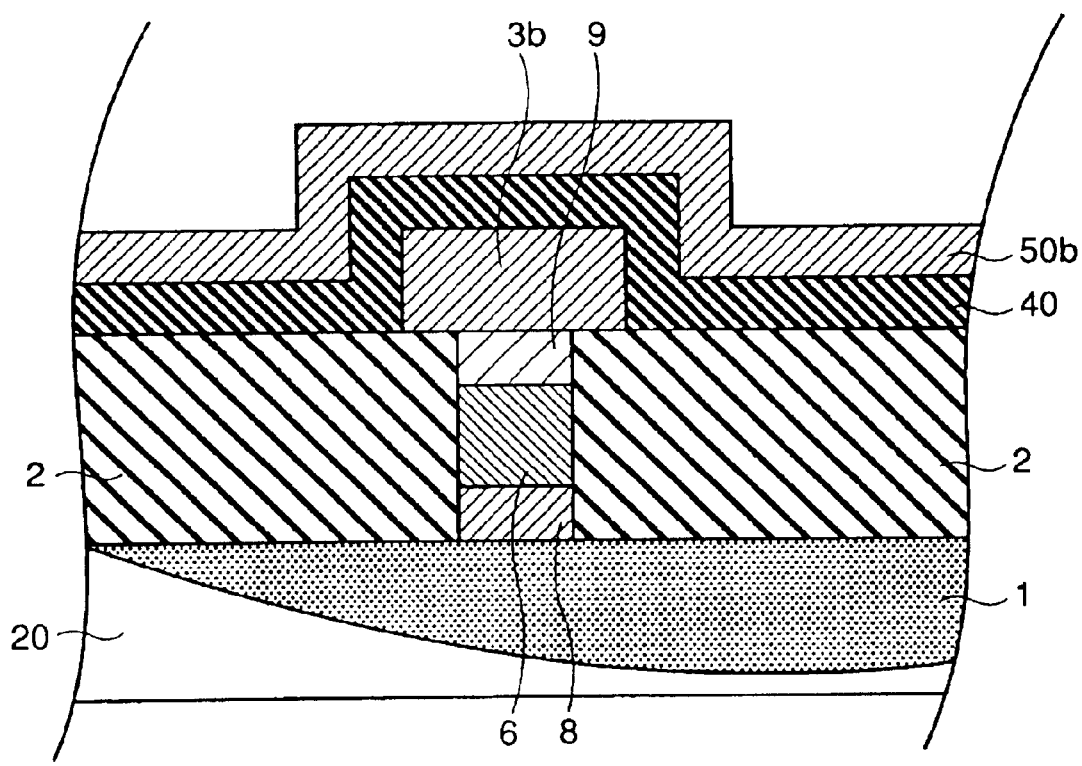
Figure 16:
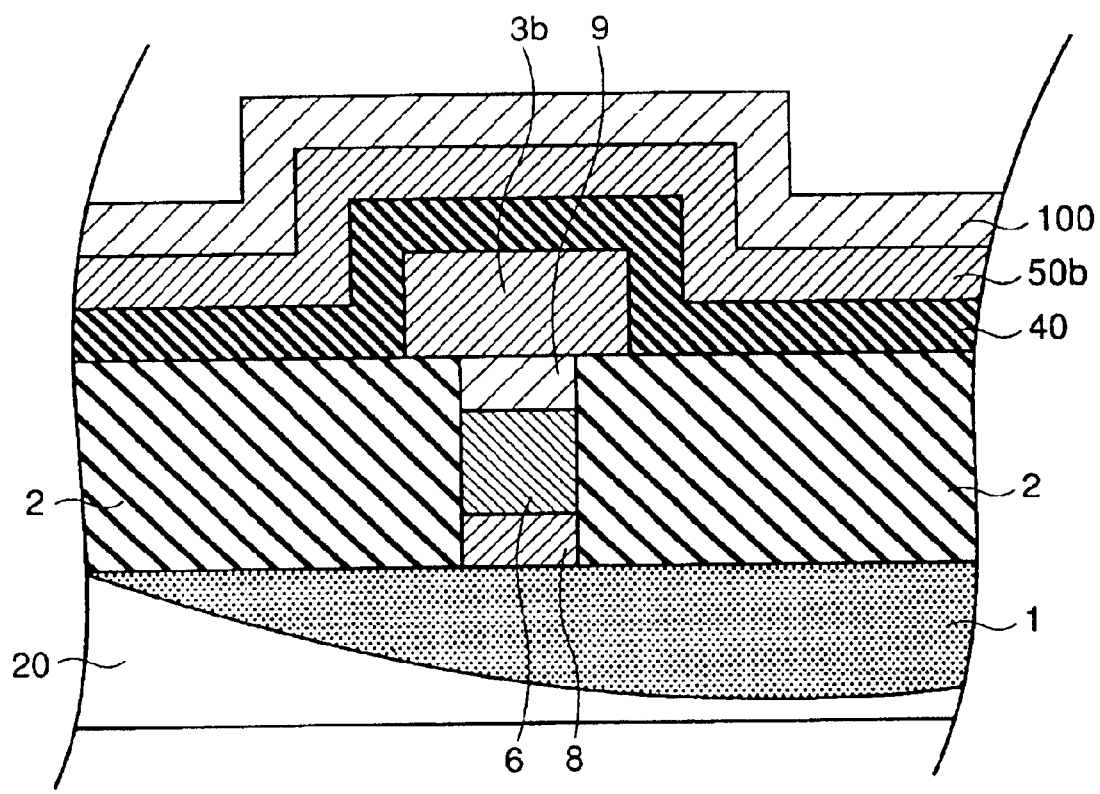
Figure 17:
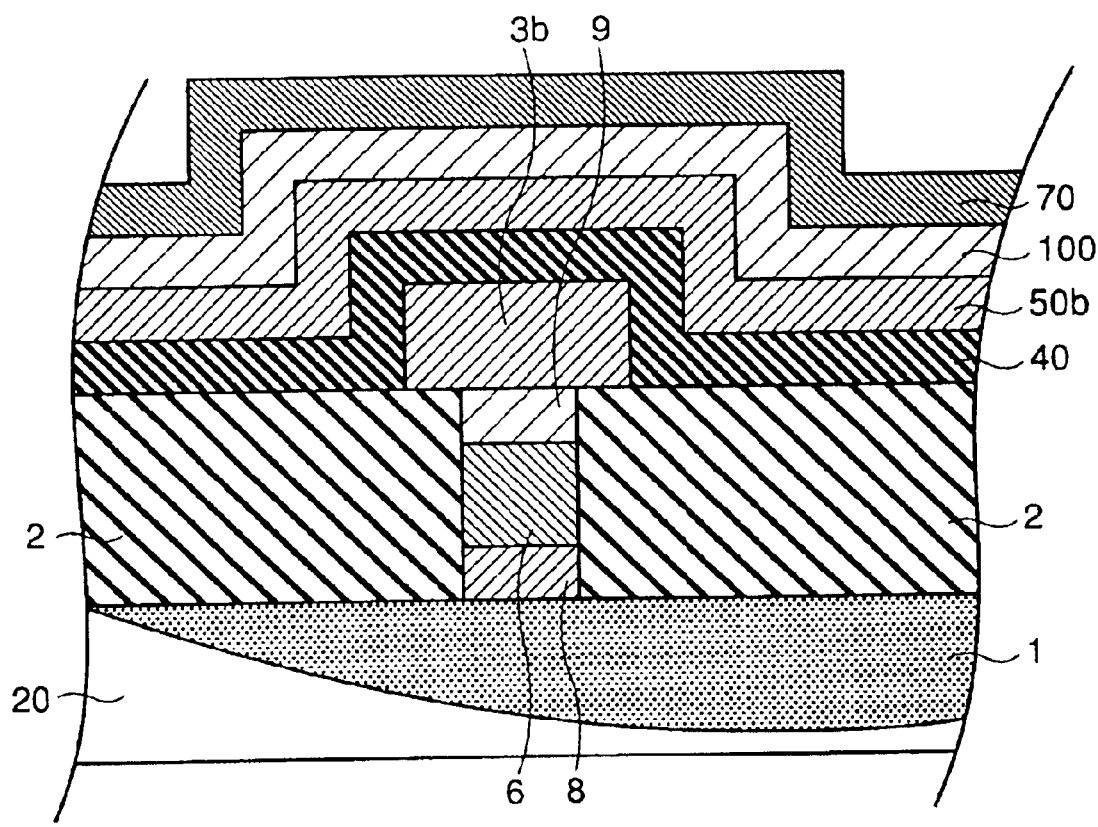
Figure 18:
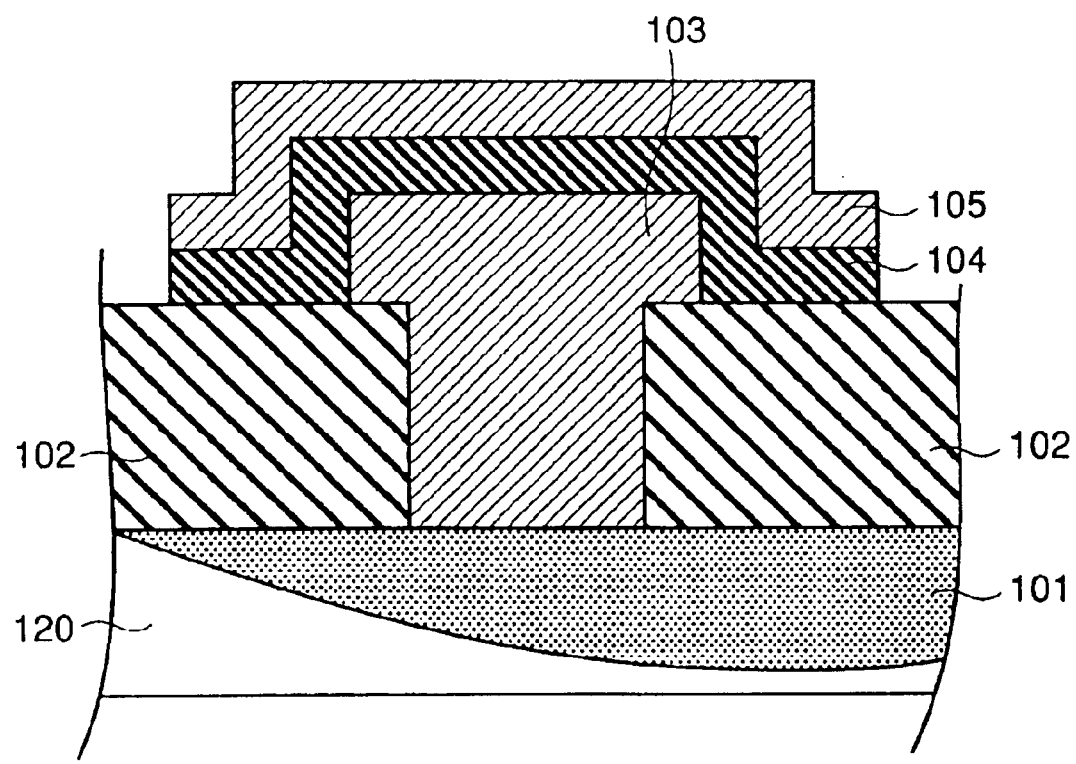
FIG. 18 is a diagram schematically showing a cross sectional structure of a conventional semiconductor device.

Next, as shown in FIG. 13, indium oxide film 30b is etched to a prescribed pattern to form indium oxide film 3b as a part of the storage electrode. Thereafter, as shown in FIG. 14, a tantalum oxide ($Ta_2O_5$) film 40 is formed by CVD to continuously cover the surface of indium oxide film 3b and the upper surface of interlayer oxide film 2. In this CVD for forming tantalum oxide film 40, $Ta(OC_2H_5)$ as a raw material is forced to react within the oxygen gas, and the tantalum oxide thus generated is deposited on indium oxide film 3b under a pressure of 1 Torr at a temperature of 450° C. Thereafter, as shown in FIG. 15, indium oxide film 50b is formed to cover the upper surface of tantalum oxide film 40. Next, as shown in FIG. 16, tantalum nitride film 100 is formed on indium oxide film 50b. Thereafter, as shown in FIG. 17, copper film 70 is formed by sputtering on tantalum nitride film 100. Next, tantalum oxide film 40, indium oxide film 50b, tantalum nitride film 100 and copper film 70 are etched to a prescribed pattern so as to form, as shown in FIG. 9, the capacitor dielectric film with tantalum oxide film 4, and the cell plate electrode with indium oxide film 5b, tantalum nitride film 10 and copper film 7. Thus, the capacitor of the semiconductor device of the present embodiment is completed.

With such a manufacturing method, tantalum nitride film 9 offering a good barrier is formed as a part of the storage electrode, beneath and contacting the lower surface of indium oxide film 3b. This allows formation of a capacitor in which counter diffusion of indium oxide film 3b and tungsten film 6 is restricted. Accordingly, a capacitor can be formed in which generation of a leakage current in the capacitor dielectric film due to the counter diffusion of the contact plug and the storage electrode is suppressed. As a result, it is possible to manufacture a semiconductor device provided with a capacitor having an improved charge retaining capability when the indium oxide film that is unlikely to cause reduction of the tantalum oxide film during the manufacturing process is formed as a part of the storage electrode.

Further, tantalum nitride film 10 offering an effective barrier is formed between two layers of the cell plate electrode, i.e., indium oxide film 5b and copper film 7. Therefore, it is possible to form a cell plate electrode in which counter diffusion of indium oxide film 5b and copper film 7 is restricted. Accordingly, a capacitor can be formed in which generation of a leakage current in the capacitor dielectric film due to the counter diffusion within the cell plate electrode is restricted. As a result, it is again possible to manufacture a semiconductor device having a capacitor with an improved charge retaining capability when a highly conductive copper film is used to form a part of the cell plate electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a contact plug including a tungsten film in an upper portion of the contact plug, formed on a semiconductor substrate;
   a storage electrode including a tantalum nitride film formed on and contacting an upper surface of said tungsten film;
   a capacitor dielectric film including a tantalum oxide film formed on and contacting an upper surface of said tantalum nitride film; and
   a cell plate electrode including a tantalum nitride film formed on and contacting an upper surface of said tantalum oxide film, wherein the tantalum nitride films of said storage electrode and said cell plate electrode each have a work function greater than 4.95 eV.

2. A semiconductor device, comprising:
   a storage electrode including a first tantalum nitride film formed over a semiconductor substrate;
   a capacitor dielectric film including a tantalum oxide film formed on and contacting an upper surface of said first tantalum nitride film; and
   a cell plate electrode including a second tantalum nitride film formed on and contacting an upper surface of said tantalum oxide film and a copper film formed on and contacting an upper surface of said second tantalum nitride film, wherein said first and second tantalum nitride films each have a work function greater than 4.95 eV.

3. A semiconductor device, comprising:
   a semiconductor substrate;
   a contact plug including tungsten formed on the semiconductor substrate;
   a storage electrode including a first indium oxide film formed on and contacting an upper surface of said contact plug;
   a capacitor dielectric film including a tantalum oxide film formed on and contacting an upper surface of said first indium oxide film, wherein said tantalum oxide film consists of tantalum and oxygen; and
   a cell plate electrode including a second indium oxide film formed on and contacting an upper surface of said tantalum oxide film.

4. A semiconductor device, comprising:
   a semiconductor substrate;
   a contact plug including tungsten formed on the semiconductor substrate;
   a storage electrode including a first indium oxide film formed on and contacting an upper surface of said contact plug;
   a capacitor dielectric film including a tantalum oxide film formed on and contacting an upper surface of said first indium oxide film; and
   a cell plate electrode including a second indium oxide film formed on and contacting an upper surface of said tantalum oxide film, wherein
   said storage electrode further includes a tantalum nitride film formed beneath and contacting a lower surface of said first indium oxide film.

5. A semiconductor device, comprising:
   a semiconductor substrate;
   a contact plug including tungsten formed on the semiconductor substrate;
   a storage electrode including a first indium oxide film formed on and contacting an upper surface of said contact plug;
   a capacitor dielectric film including a tantalum oxide film formed on and contacting an upper surface of said first indium oxide film; and
   a cell plate electrode including a second indium oxide film formed on and contacting an upper surface of said tantalum oxide film, wherein said cell plate electrode further includes a copper film formed on said second indium oxide film.

6. The semiconductor device according to claim 5, wherein said cell plate electrode further includes a tantalum nitride film formed between said second indium oxide film and said copper film, contacting both said second indium oxide film and said copper film.

7. The semiconductor device according to claim 1, wherein said work function of the tantalum nitride films is up to 5.41 eV.

8. The semiconductor device according to claim 1, wherein said work function of the tantalum nitride films is equal to or greater than 5.41 eV.

9. The semiconductor device according to claim 1, wherein said work function of the tantalum nitride films is 5.41 eV.

10. The semiconductor device according to claim 2, wherein said work function of the tantalum nitride films is up to 5.41 eV.

11. The semiconductor device according to claim 2, wherein said work function of the tantalum nitride films is equal to or greater than 5.41 eV.

12. The semiconductor device according to claim 2, wherein said work function of the tantalum nitride films is 5.41 eV.

13. The semiconductor device according to claim 1, wherein the bottom of said contact plug is formed with a conductor different from tungsten.

14. The semiconductor device according to claim 3, wherein said tantalum oxide film consists of $Ta_2O_5$.

15. A semiconductor device, comprising:
    a storage electrode including a tantalum nitride film formed above a semiconductor substrate;
    a capacitor dielectric film including a tantalum oxide film formed on and contacting an upper surface of said tantalum nitride film; and
    a cell plate electrode including a tantalum nitride film formed on and contacting an upper surface of said tantalum oxide film, wherein the tantalum nitride films of said storage electrode and said cell plate electrode each have a work function greater than 4.95 eV.

16. A semiconductor device, comprising:
    a storage electrode including a first indium oxide film formed above a semiconductor substrate;
    a capacitor dielectric film including a tantalum oxide film formed on and contacting an upper surface of said first indium oxide film, wherein said tantalum oxide film consists of tantalum and oxygen; and
    a cell plate electrode including a second indium oxide film formed on and contacting an upper surface of said tantalum oxide film.

* * * * *